United States Patent
Yoshida (10) Patent No.: US 7,434,135 B2
(45) Date of Patent: Oct. 7, 2008

(54) DECODER AND METHOD FOR DECODING LOW-DENSITY PARITY-CHECK CODE

(75) Inventor: Kenji Yoshida, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 580 days.

(21) Appl. No.: 11/216,108

(22) Filed: Sep. 1, 2005

(65) Prior Publication Data
US 2006/0123315 A1 Jun. 8, 2006

(30) Foreign Application Priority Data
Nov. 8, 2004 (JP) ............................. 2004-324382

(51) Int. Cl.
*H03M 13/11* (2006.01)
*H03M 13/45* (2006.01)

(52) U.S. Cl. ...................... 714/752; 714/780

(58) Field of Classification Search ................ 714/752, 714/780
See application file for complete search history.

(56) References Cited

U.S. PATENT DOCUMENTS

| | | | |
|---|---|---|---|
| 6,061,823 A | | 5/2000 | Nara |
| 6,686,853 B2 | | 2/2004 | Shen et al. |
| 6,718,508 B2 | * | 4/2004 | Lodge et al. ............... 714/780 |
| 6,751,770 B2 | * | 6/2004 | Morelos-Zaragoza ....... 714/781 |
| 6,865,708 B2 | * | 3/2005 | Wang ......................... 714/758 |
| 6,888,897 B1 | * | 5/2005 | Nazari et al. ............... 375/262 |
| 7,055,090 B2 | * | 5/2006 | Kikuchi et al. ............. 714/801 |
| 7,058,873 B2 | * | 6/2006 | Song et al. ................. 714/752 |
| 7,133,853 B2 | * | 11/2006 | Richardson et al. .......... 706/15 |
| 7,137,060 B2 | * | 11/2006 | Yu et al. .................... 714/794 |
| 7,174,495 B2 | * | 2/2007 | Boutillon et al. ............ 714/752 |
| 7,178,080 B2 | * | 2/2007 | Hocevar ..................... 714/752 |
| 7,178,081 B2 | * | 2/2007 | Lee et al. ................... 714/752 |
| 7,219,288 B2 | * | 5/2007 | Dielissen et al. ............ 714/752 |
| 7,237,174 B2 | * | 6/2007 | Eroz et al. .................. 714/758 |
| 7,243,287 B2 | * | 7/2007 | Cameron et al. ............ 714/752 |
| 7,251,770 B2 | * | 7/2007 | Bottomley et al. .......... 714/755 |

(Continued)

FOREIGN PATENT DOCUMENTS

JP 2004-104686 4/2004

OTHER PUBLICATIONS

European Search Report issued by the European Patent Office dated Mar. 10, 2006, for European Patent Application No. 05107528.1.

(Continued)

*Primary Examiner*—Stephen M. Baker
(74) *Attorney, Agent, or Firm*—Finnegan, Henderson, Farabow, Garrett & Dunner, L.L.P.

(57) ABSTRACT

When received data is decoded, a CPU stores a value "1", which is included in a vector obtained by multiplying the received data by a parity check matrix, as the number of parity errors and also stores hard-decision result information corresponding to the number of parity errors in an output candidate information storage area. If the CPU determines that the received data is uncorrectable after the received data is decoded a given number of times, it reads hard-decision result information corresponding to the smallest number of parity errors, which are included in the number of parity errors stored in the output candidate information storage area and outputs it as a decoding result.

10 Claims, 4 Drawing Sheets

U.S. PATENT DOCUMENTS

| | | | | |
|---|---|---|---|---|
| 7,260,766 B2* | 8/2007 | Levy et al. | ................... | 714/780 |
| 7,266,750 B1* | 9/2007 | Patapoutian et al. | ........ | 714/758 |
| 7,296,216 B2* | 11/2007 | Shen et al. | ................... | 714/801 |
| 7,310,768 B2* | 12/2007 | Eidson et al. | ................ | 714/786 |
| 7,340,003 B1* | 3/2008 | Nazari et al. | ................. | 375/262 |
| 7,346,117 B2* | 3/2008 | Li | ............................... | 375/262 |
| 2003/0203435 A1 | 10/2003 | Ashkenazi et al. | | |
| 2004/0123216 A1 | 6/2004 | Nefedov | | |
| 2004/0140915 A1 | 7/2004 | Shen et al. | | |

OTHER PUBLICATIONS

Ahmed et al., "Performance Analysis of the Adaptive Parity Check Matrix Based Soft-Decision Decoding Algorithm," IEEE (2004), pp. 1995-1999.

Reid et al., "Convergence and Errors in Turbo-Decoding," IEEE Transactions on Communications (Dec. 2001), 49:2045-51.

Fossorier, "Iterative Reliability-Based Decoding of Low-Density Parity Check Codes," IEEE Journal on Selected Areas in Communications (May 2001), 19:908-917.

Blanksby et al., "A 690-mW 1-Gb/s 1024-b, Rate-1/2 Low-Density Parity-Check Code Decoder", IEEE Journal of Solid-State Circuits, vol. 37, No. 3, pp. 404-412, (2002).

* cited by examiner

DECODER AND METHOD FOR DECODING LOW-DENSITY PARITY-CHECK CODE

CROSS-REFERENCE TO RELATED APPLICATIONS

This application is based upon and claims the benefit of priority from prior Japanese Patent Application No. 2004-324382, filed Nov. 8, 2004, the entire contents of which are incorporated herein by reference.

BACKGROUND OF THE INVENTION

1. Field of the Invention

The present invention relates to a decoder for decoding a low-density parity-check code and a method for doing the same.

2. Description of the Related Art

A low-density parity-check code (hereinafter referred to as LDPC code) has recently been noted as an error checking and correcting code. Message-passing algorithm is known as a technology for decoding an LDPC code (see, for example, Andrew J. Blanksby and Chris J. Howland, "A 690-mW 1-Gb/s 1024-b, Rate-1/2 Low-Density Parity-Check Code Decoder", IEEE Journal of Solid-State Circuits, Vol. 37, No. 3, March 2002, pp. 404-412. In the message-passing algorithm, a bit update for each row of a check matrix (parity check matrix) for an LDPC code and a parity update for each column thereof are repeated in order to decode the LDPC code.

The above LDPC code is very strong. If, however, it is decoded repeatedly, the number of errors may increase or decrease in intermediate results obtained from the decoding. If, in particular, the number of uncorrectable errors caused in the intermediate results is graphed, it may increase or decrease with a large amplitude. If an LDPC code is determined as an uncorrectable one after its decoding is repeated a given number of times, a result of the decoding is likely to be output when the above amplitude is high, or when the number of errors increases.

BRIEF SUMMARY OF THE INVENTION

The present invention has been developed in consideration of the above situation, and its object is to provide a decoder for decoding a low-density parity-check code, which is capable of reducing the number of error bits included in uncorrectable errors, and a method for doing the same.

According to an aspect of the present invention, there is provided a low-density parity-check code decoder comprising storage means for when received data is decoded using a given parity check matrix, storing a value "not zero" included in a vector obtained by multiplying the parity check matrix and the received data as the number of parity errors, and storing hard-decision result information corresponding to the number of parity errors, and output means for when it is determined that the received data is uncorrectable after the received data is decoded a given number of times, outputting hard-decision result information corresponding to the smallest number of parity errors, which is included in the number of parity errors stored in the storage means, as a decoding result.

In the above-described low-density parity-check code decoder, when received data is decoded using a given parity check matrix, a value "1" included in the vector obtained by multiplying the parity check matrix and the received data is stored as the number of parity errors and hard-decision result information corresponding to the number of parity errors is stored. When it is determined that the received data is uncorrectable after the received data is decoded a given number of times, the smallest number of parity errors is specified, and its corresponding hard-decision result information is read out and output as a decoding result. Thus, when it is determined that the received data is uncorrectable, the hard-decision result information corresponding to the smallest number of parity errors can be output as a decoding result.

When a low-density parity-check code is decoded and determined as an uncorrectable one, not a bit determination result but a determination result obtained when the number of parity errors is the smallest is output, with the result that the average number of error bits in the code can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will be described with reference to the accompanying drawings.

First Embodiment

Figure 1:
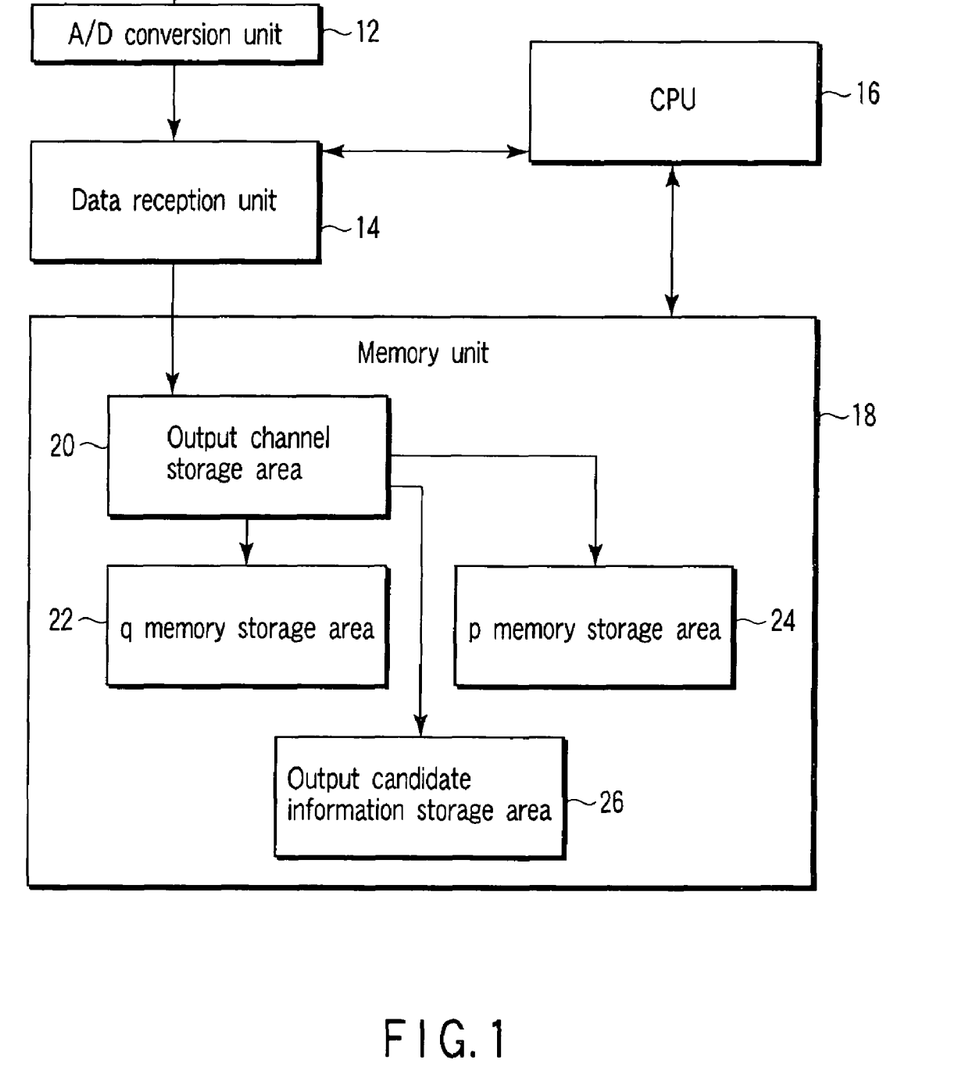
FIG. 1 is a block diagram showing a low-density parity-check code decoding system to which a low-density parity-check code decoder according to a first embodiment of the present invention is applied.

FIG. 1 is a block diagram showing a low-density parity-check (LDPC) code decoding system to which an LDPC code decoder according to a first embodiment of the present invention is applied.

The LDPC code decoding system comprises an A/D conversion unit 12 which converts received analog data into digital data, a data reception unit 14 which receives the digital data and outputs channel data, a memory unit 18 which stores the received data and the like, and a central processing unit (CPU) 16 serving as a controller which controls the LDPC code decoding system. The memory unit 18 includes an output channel data storage area 20 which stores output channel information, q and p memory storage areas 22 and 24 which copy and store arbitrary data stored in the storage area 20, and an output candidate information storage area 26 which stores the number whose value is "1" in a vector obtained by multiplying the received data by a parity check matrix, as the number of parity errors and then stores hard-decision result information corresponding to the number of parity errors.

Figure 2:
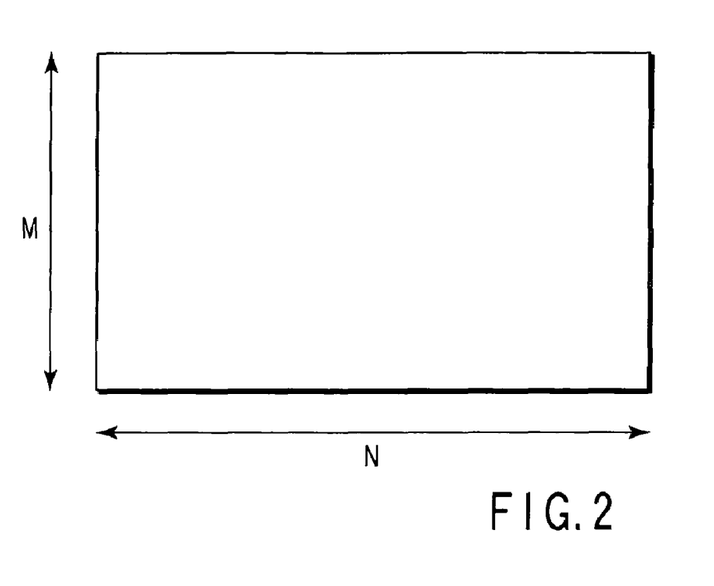
FIG. 2 is a schematic diagram showing a parity check matrix of a low-density parity-check code, to which the low-density parity-check code decoder according to the first embodiment of the present invention is applied.

FIG. 2 is a schematic diagram showing a parity check matrix H of an LDPC code, to which the LDPC code decoder according to the first embodiment of the present invention is applied.

The parity check matrix H is based on the premise that the LDPC code is N (=sm) bits. The j-th (j=1, 2, ..., N) bit of the LDPC code is represented by $x_j$. As is known, each of rows of the parity check matrix H can be considered to be one parity check equation. The parity check equation corresponding to the i-th row of the parity check matrix H is called an i-th parity check equation. The N-bit LDPC code has to satisfy all parity check equations in the parity check matrix H, namely, the first to the M-th parity check equations therein.

In order to decode an LDPC code by the message-passing algorithm, generally, a bit update and a parity update need to be repeated.

The bit update is usually expressed by the following equation:

$$r_{i,j} = -\prod_{j' \in M(i)\setminus j} sgn(q_{i,j'}) \Psi\left(\prod_{j' \in M(i)\setminus j} \Psi(q_{i,j'})\right) \quad (1)$$

where $r_{i,j}$ is obtained by transferring parity information (reliability information) $q_{i,j'}$, which corresponds to the bits (except the j-th bit) of the I-th row in the parity check matrix H, from a parity node to a bit node, $r_{i,j}$ is bit information (reliability information) indicating the reliability of the j-th bit $x_j$ of the i-th row in the parity check matrix H, and $r_{i,j}$ indicates not the probability that the bit $x_j$ is "0" or "1" but a logarithm of the probability, the logarithm being used to allow multiplication and division to be replaced with addition and subtraction;

M(i) is a set of bit positions of "1" in the i-th row in the parity check matrix H;

M(i)\j is M(i) except the j-th bit;

j'∈M(i)\j is an arbitrary one of the bit positions included in M(i) except the j-th bit;

$q_{i,j'}$ is parity information (reliability information) indicating the reliability of the j-th bit $x_{j'}$ of the i-th row in the parity check matrix H, and $q_{i,j'}$ indicates not the probability that bit $x_{j'}$ is "0" or "1" but a logarithm of the probability;

$sgn(q_{i,j'})$ is a code of $q_{i,j'}$, this code is represented by the most significant bit MSB of $q_{i,j'}$, $sgn(q_{i,j'})=-1$ and $MSB(q_{i,j'})=1$ when $q_{i,j'}$ is negative, and $sgn(q_{i,j'})=+1$ and $MSB(q_{i,j'})=0$ when $q_{i,j'}$ is not negative, namely, zero or positive; and $\Psi(\ )$ is the function of a probability operation (hereinafter referred to as $\Psi$ function).

The parity update is expressed by the following equation:

$$q_{i,j} = p_j + \sum_{i' \in N(j)\setminus i} r_{i',j} \quad (2)$$

where $q_{i,j}$ is obtained by transferring bit information (reliability information) $r_{i,j}$, which corresponds to the bits (except the i-th bit) of the j-th row in the parity check matrix H, from a bit node to a parity node, $q_{i,j}$ is parity information (reliability information) indicating the reliability of the j-th bit $x_j$ of the i-th row in the parity check matrix H, and $q_{i,j}$ is used as $q_{i,j'}$ for the bit update given by the above equation (1).

Pj is a logarithm of the probability (initial probability) that when an LDPC code is output through a communication channel, the j-th bit $x_j$ in the LDPC code is "1" or "0", and Pj coincides with the initial value of $q_{i,j}$ corresponding to the bits of "1" in the parity check matrix H;

N(j) is a set of bit positions of "1" in the j-th column in the parity check matrix H;

N(j)\i is N(j) except the i-th bit;

i'∈N(j)\i is an arbitrary one of the bit positions included in N(j) except the i-th bit; and $r_{i',j}$ is bit information (reliability information) indicating the reliability of the j-th bit $x_j$ of the I-th row in the parity check matrix H, and $r_{i,j}$ in the above equation (1) is used for $r_{i',j}$.

Figure 3:
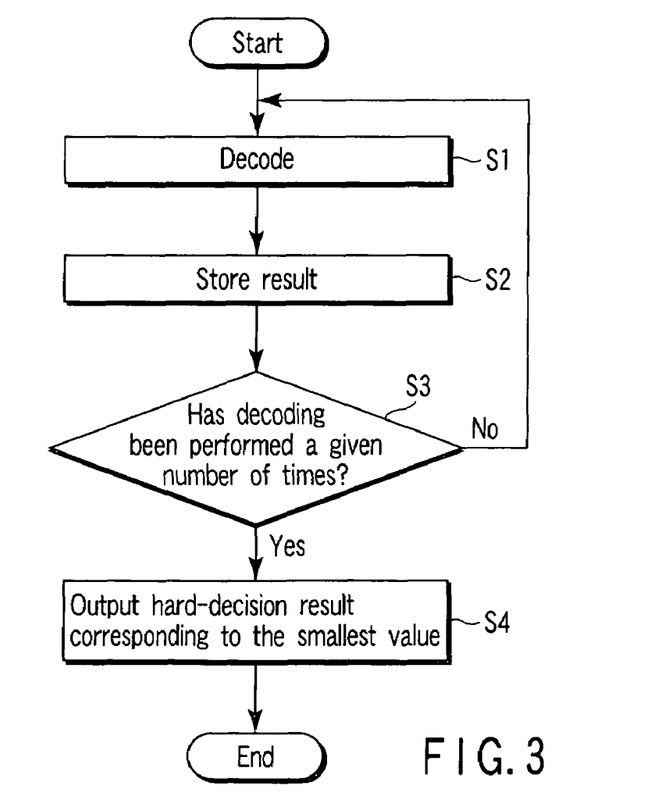
FIG. 3 is a flowchart explaining a method for decoding a low-density parity-check code according to the first embodiment of the present invention.

A method for decoding an LDPC code according to the first embodiment will be described with reference to the flowchart shown in FIG. 3.

For example, the parity check matrix H is expressed by the following equation:

$$H = \begin{pmatrix} 0 & 0 & 0 & 0 & 0 & 1 & 0 & 0 & 0 & 0 & 1 & 0 & 0 & 0 & 1 & 0 & 0 & 0 \\ 1 & 0 & 0 & 0 & 0 & 0 & 0 & 0 & 0 & 0 & 0 & 1 & 0 & 0 & 0 & 1 & 0 & 0 \\ 0 & 1 & 0 & 0 & 0 & 0 & 1 & 0 & 0 & 0 & 0 & 0 & 0 & 0 & 0 & 0 & 1 & 0 \\ 0 & 0 & 1 & 0 & 0 & 0 & 0 & 1 & 0 & 0 & 0 & 0 & 0 & 0 & 0 & 0 & 0 & 1 \\ 0 & 0 & 0 & 1 & 0 & 0 & 0 & 0 & 1 & 0 & 0 & 0 & 1 & 0 & 0 & 0 & 0 & 0 \\ 0 & 0 & 0 & 0 & 1 & 0 & 0 & 0 & 0 & 1 & 0 & 0 & 0 & 1 & 0 & 0 & 0 & 0 \\ 0 & 0 & 0 & 0 & 0 & 1 & 0 & 0 & 0 & 0 & 1 & 0 & 0 & 0 & 1 & 0 & 0 & 0 & 0 \\ 0 & 1 & 0 & 0 & 0 & 0 & 0 & 0 & 1 & 0 & 0 & 0 & 0 & 0 & 0 & 1 & 0 & 0 \\ 0 & 0 & 1 & 0 & 0 & 0 & 0 & 0 & 0 & 1 & 0 & 0 & 0 & 0 & 0 & 0 & 1 & 0 \\ 0 & 0 & 0 & 1 & 0 & 0 & 0 & 0 & 0 & 0 & 1 & 0 & 0 & 0 & 0 & 0 & 0 & 1 \\ 0 & 0 & 0 & 0 & 1 & 0 & 0 & 0 & 0 & 0 & 0 & 1 & 0 & 1 & 0 & 0 & 0 & 0 & 0 \\ 0 & 0 & 0 & 0 & 0 & 1 & 0 & 0 & 0 & 0 & 0 & 0 & 1 & 0 & 1 & 0 & 0 & 0 & 0 \\ 0 & 0 & 0 & 0 & 0 & 1 & 1 & 0 & 0 & 0 & 0 & 0 & 0 & 0 & 1 & 0 & 0 & 0 & 0 \\ 1 & 0 & 0 & 0 & 0 & 0 & 0 & 1 & 0 & 0 & 0 & 0 & 0 & 0 & 0 & 1 & 0 & 0 & 0 \end{pmatrix}$$

The CPU 16 decodes received data in step S1. The parity check matrix H expressed by the equation (3) is multiplied by the following expression as received data to be decoded:

$$\begin{pmatrix} 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 1 \\ 1 \end{pmatrix}$$

Thus, the following expression is obtained:

$$\begin{pmatrix} 0 \\ 0 \\ 1 \\ 1 \\ 0 \\ 0 \\ 0 \\ 0 \\ 1 \\ 1 \\ 0 \\ 0 \\ 0 \\ 0 \end{pmatrix}$$

Since the lowest two elements in the expression (4) are "1", the expression (4) is multiplied by the equation (3) indicative of the parity check matrix H. More specifically, when the number of values "1" in each row of the parity check matrix H is odd, the value of the vector is "1" and when it is even, the value of the vector is "0" and in this case the expression (5) is output as the vector. Regarding the output vector, the number of values "1" is stored in the output candidate information storage area 26 of the memory unit 18 as the number of parity errors (output candidate information) by the CPU 16 in step S2. Since the expression (5) includes four values "1", the number of parity errors is stored as "4" in the storage area 26. Hard-decision result information (e.g., data of "0" and "1") corresponding to the number of parity errors is also stored therein.

In step S3, the CPU 16 determines whether the decoding has been performed a given number of times. If the decoding has not yet been done, it is repeated a given number of times (assume here that "4", "10", "14", "20", "17" and "41" are stored as the number of parity errors. Information about the number of repetitions of decoding is stored in advance in the output candidate information storage area 26 and referred to by the CPU 16 when the need arises.

After the CPU 16 determines that the decoding has been performed a given number of times in step S3, it determines the smallest number of parity errors stored in the storage area 26 in step S4. Since "4", "10", "14", "20", "17" and "41" are stored as the number of parity errors, the smallest one is "4". The CPU 16 reads out hard-decision result information corresponding to the number of parity errors, which is determined as the smallest one, and outputs it as decoding result data.

As described above, even when an LDPC code is decoded a given number of times and determined as an uncorrectable one, a bit determination result is not output as it is, but a determination result (hard-decision result information) obtained when the number of parity errors is the smallest is output, with the result that the average number of error bits in the code can be reduced. In other words, even though an uncorrectable error occurs, the average error rate included therein can be reduced. Consequently, in a system requiring a data transfer speed not lower than a fixed speed, relatively-low-error data such as video data and voice data is transferred and an error to be recognized by a user can be decreased. In a junction code system in which outer codes exist outside an LDPC code decoder, the outer codes can increase correction probability.

Value "1" which is "not zero" is stored and the smallest one of the stores values is used. In addition to this, value "0" which is "zero" can be stored and the largest one of the stored values can be used.

Second Embodiment

Figure 4:
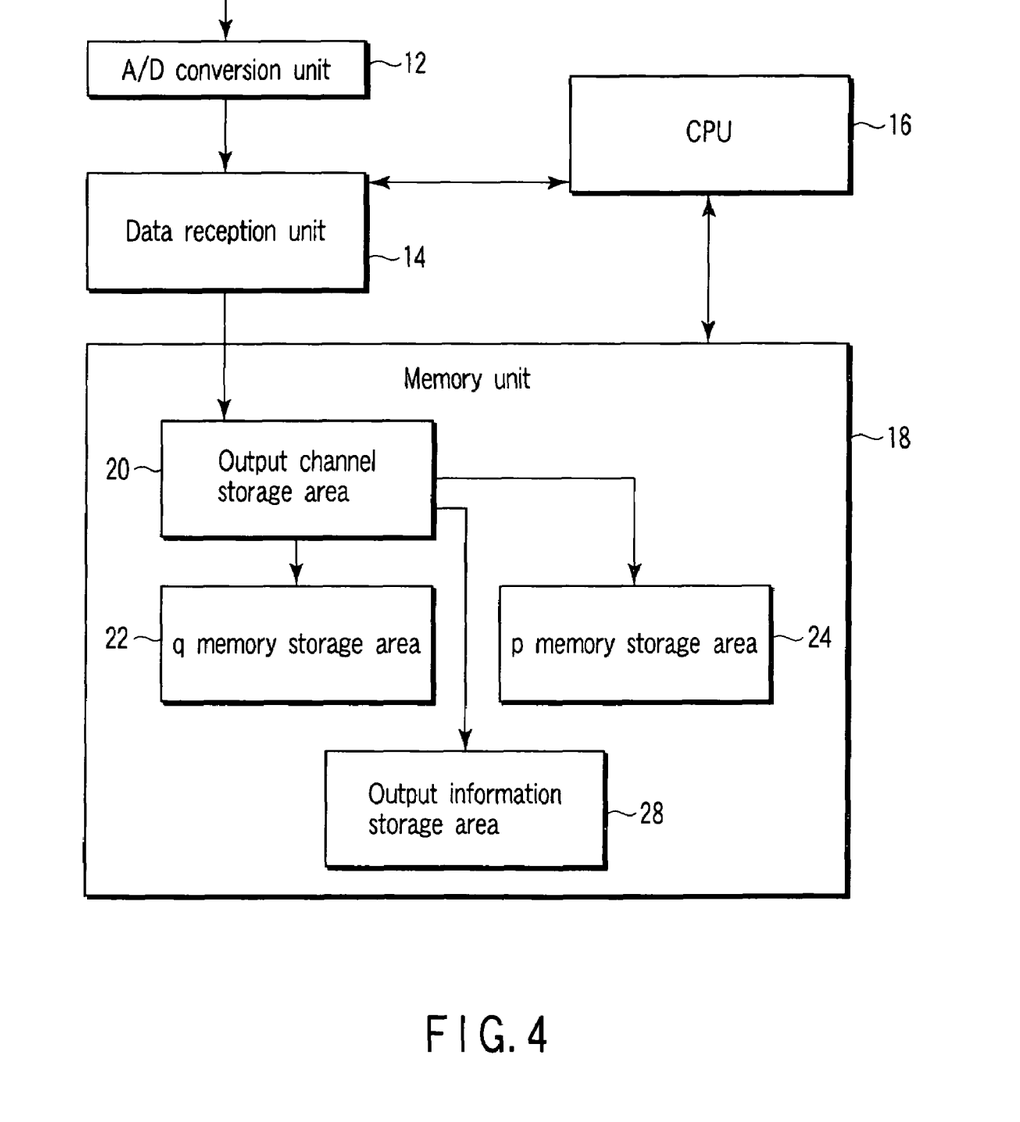
FIG. 4 is a block diagram showing a low-density parity-check code decoding system to which a low-density parity-check code decoder according to a second embodiment of the present invention is applied.

FIG. 4 is a block diagram showing an LDPC code decoding system to which an LDPC code decoder according to a second embodiment of the present invention is applied.

Assume in the second embodiment that a memory unit 18 includes an output information storage area 28 corresponding to the output candidate information storage area 26 of the first embodiment. The storage area 28 stores not all result data (hard-decision result information corresponding to the number of parity errors) but only the smallest number of parity errors together with its corresponding hard-decision result information. Old result data is then overwritten and erased.

Figure 5:
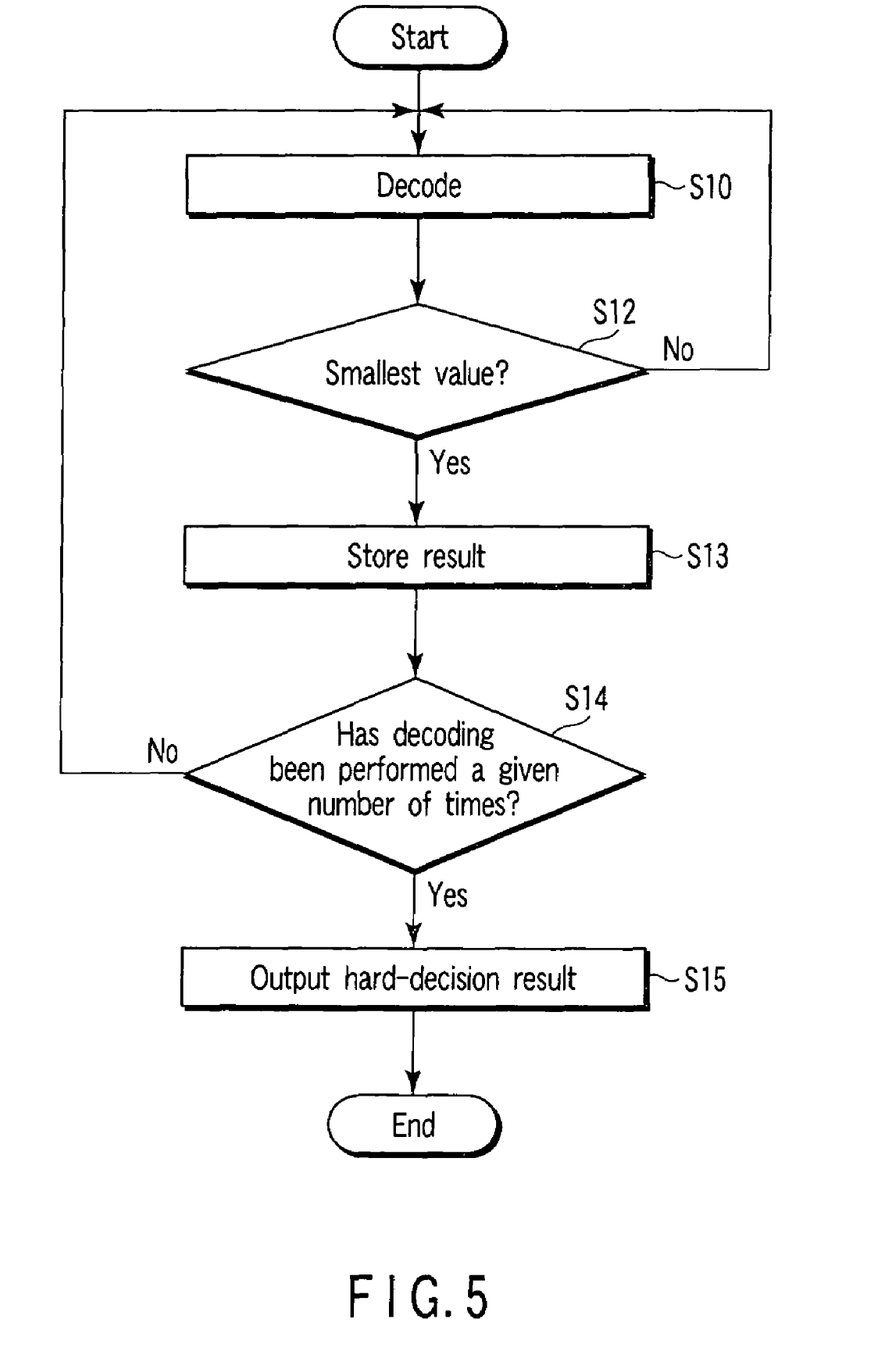
FIG. 5 is a flowchart explaining a method for decoding a low-density parity-check code according to the second embodiment of the present invention.

A method for decoding an LDPC code according to the second embodiment will be described with reference to the flowchart shown in FIG. 5.

A CPU 16 decodes received data in step S10 and determines whether the number of parity errors is the smallest or not as result data in step S11. Referring to the number of parity errors stored in the output information storage area 28 of the memory unit 18, the CPU 16 determines whether the number of parity errors is smaller. If the CPU 16 determines in step S12 that the number of parity errors is the smallest, new result data is stored in place of the stored result data in step S13. Then, the CPU 16 determines whether the data is decoded a given number of times in step S14. If the decoding is performed a given number of times, the CPU 16 reads hard-decision result information corresponding to the number of parity errors stored in the output information storage area 28 in step S15 and outputs it as a decoding result.

As described above, not all result data need to be stored. Therefore, the storage area of the memory unit 18 can be decreased in size and the output time of the decoding result can be shortened.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A low-density parity-check code decoder comprising:
   storage means for when received data is decoded using a given parity check matrix, storing a value "not zero" included in a vector obtained by multiplying the parity check matrix and the received data as the number of parity errors, and storing hard-decision result information corresponding to the number of parity errors; and
   output means for when it is determined that the received data is uncorrectable after the received data is decoded a given number of times, outputting hard-decision result information corresponding to the smallest number of parity errors, which is included in the number of parity errors stored in the storage means, as a decoding result.

2. A low-density parity-check code decoder comprising:
   storage means for when received data is decoded using a given parity check matrix, storing a value "not zero", which is included in a vector obtained by multiplying the parity check matrix and the received data, as the number of parity errors and when it is determined that the number of parity errors is the smallest in the stored number of parity errors, storing the smallest number of parity errors and hard-decision result information corresponding thereto as hard decision result information in place of the stored number of parity errors and hard-decision result information corresponding thereto; and output means for when it is determined that the received data is uncorrectable after the received data is decoded a given number of times, outputting the hard-decision result information, which is read out of the storage means, as a decoding result.

3. The low-density parity-check code decoder according to claim 1, wherein when the parity check matrix and the received data are multiplexed, a value of the vector is "1" if the number of values "1" included in rows of the parity check matrix is odd, and a value of the vector is "0" if the number of values "1" included in the rows of the parity check matrix is even.

4. The low-density parity-check code decoder according to claim 2, wherein when the parity check matrix and the received data are multiplexed, a value of the vector is "1" if the number of values "1" included in rows of the parity check matrix is odd, and a value of the vector is "0" if the number of values "1" included in the rows of the parity check matrix is even.

5. A low-density parity-check code decoder comprising:
storage means for when received data is decoded using a given parity check matrix, storing a value "zero" which is included in a vector obtained by multiplying the parity check matrix and the received data; and output means for when it is determined that the received data is uncorrectable after the received data is decoded a given number of times, outputting the largest one of values from, which are stored in the storage means, as a decoding result.

6. A method for decoding a low-density parity-check code, comprising:
a step of, when received data is decoded using a given parity check matrix, storing a value "not zero" included in a vector obtained by multiplying the parity check matrix and the received data as the number of parity errors, and storing hard-decision result information corresponding to the number of parity errors; and a step of, when it is determined that the received data is uncorrectable after the received data is decoded a given number of times, outputting hard-decision result information corresponding to the smallest number of parity errors, which is included in the number of parity errors stored in the storage means, as a decoding result.

7. A method for decoding a low-density parity-check code, comprising:
a step of, when received data is decoded using a given parity check matrix, storing a value "not zero", which is included in a vector obtained by multiplying the parity check matrix and the received data, as the number of parity errors, and when it is determined that the number of parity errors is the smallest in the stored number of parity errors, storing the smallest number of parity errors and hard-decision result information corresponding thereto as hard decision result information in place of the stored number of parity errors and hard-decision result information corresponding thereto; and a step of, when it is determined that the received data is uncorrectable after the received data is decoded a given number of times, outputting the hard-decision result information, which is read out of the storage means, as a decoding result.

8. The method according to claim 5, wherein when the parity check matrix and the received data are multiplexed, a value of the vector is "1" if the number of values "1" included in rows of the parity check matrix is odd, and a value of the vector is "0" if the number of values "1" included in the rows of the parity check matrix is even.

9. The method according to claim 6, wherein when the parity check matrix and the received data are multiplexed, a value of the vector is "1" if the number of values "1" included in rows of the parity check matrix is odd, and a value of the vector is "0" if the number of values "1" included in the rows of the parity check matrix is even.

10. A method for decoding a low-density parity-check code, comprising:
a step of, when received data is decoded using a given parity check matrix, storing a value "zero" which is included in a vector obtained by multiplying the parity check matrix and the received data; and a step of, when it is determined that the received data is uncorrectable after the received data is decoded a given number of times, outputting the largest one of values, which are stored in the storage means, from the decodings as a decoding result.

* * * * *

UNITED STATES PATENT AND TRADEMARK OFFICE
CERTIFICATE OF CORRECTION

PATENT NO. : 7,434,135 B2
APPLICATION NO. : 11/216108
DATED : October 7, 2008
INVENTOR(S) : Yoshida It is certified that error appears in the above-identified patent and that said Letters Patent is hereby corrected as shown below:

Claim 10, column 8, lines 44-45, change "values, which" to --values which--.

Claim 10, column 8, lines 45-46, change "decodings as" to --decodings, as--.

Signed and Sealed this

Second Day of December, 2008

JON W. DUDAS
*Director of the United States Patent and Trademark Office*